United States Patent
Yokomizo

[11] Patent Number: 6,041,089
[45] Date of Patent: *Mar. 21, 2000

[54] BIT PHASE SYNCHRONIZING METHOD AND BIT PHASE SYNCHRONIZING CIRCUIT

[75] Inventor: Koichi Yokomizo, Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/788,862

[22] Filed: Jan. 23, 1997

[30] Foreign Application Priority Data

Jul. 10, 1996 [JP] Japan .................................. 8-180928

[51] Int. Cl.<sup>7</sup> ....................................................... H04L 7/02
[52] U.S. Cl. .......................... 375/371; 327/152; 327/153; 327/161; 327/163; 327/251; 327/253; 327/538
[58] Field of Search ..................................... 375/371, 373, 375/376; 370/517, 519; 327/156, 152, 153, 158, 161, 163, 262, 277, 278, 281, 284, 285, 288, 378, 251, 253, 538

[56] References Cited

U.S. PATENT DOCUMENTS

| | | | |
|---|---|---|---|
| 4,940,910 | 7/1990 | Jiang ........................................ | 327/262 |
| 5,621,774 | 4/1997 | Ishibashi et al. ........................ | 375/371 |
| 5,654,663 | 8/1997 | McClure et al. ......................... | 327/530 |
| 5,663,668 | 9/1997 | Hayashi et al. .......................... | 327/156 |

FOREIGN PATENT DOCUMENTS 4-293332  10/1992  Japan .

*Primary Examiner*—Amanda T. Le
*Attorney, Agent, or Firm*—Venable; Robert J. Frank; Allen Wood

[57] ABSTRACT

(1) A bit phase adjusting circuit receives input data Din and passes it to a first group of delay gates which are connected in series to generate a set of data available for selection, the set including the input data Din and the input Din delayed by different amounts. The bit phase adjusting circuit selects one of the data from this set and outputs it to a bit change detecting circuit having a second group of delay gates which are connected in series. (2) In the bit change detecting circuit, at a time controlled by a reference clock signal, it is judged whether or not the input and the output data of a pth-stage delay gate of the second delay gate group coincide with each other and whether or not the output data of the pth-stage delay gate and a (p+1)th-stage delay gate coincide with each other. A change point detecting signal is generated which shows whether or not a change point of the output data from the pth-stage delay gate is within a specified range before and after the judgement time. (3) The input data is synchronized in phase with the reference clock signal by changing the data that is selected by the bit phase adjusting circuit according to the change point detecting signal. Stable bit phase synchronization is achieved by a bit phase synchronizing method including the processes (1) to (3). The delay gates of at least the first group are controlled so that the respective delay quantities or duration of the delay gates can be kept constant.

16 Claims, 12 Drawing Sheets

BIT PHASE SYNCHRONIZING METHOD AND BIT PHASE SYNCHRONIZING CIRCUIT

BACKGROUND OF THE INVENTION

1. Field of the Invention

The present invention relates to a bit phase synchronizing method and a bit phase synchronizing circuit suitable for implementing the method.

2. Description of the Related Art

A system composed of plural units such as a broad-band ISDN (Integrated Services Digital Network) switching system distributes a clock signal of the same frequency to each of the units through lines from a common reference clock source. Each unit sends and receives data to and from another unit synchronously with the clock. In case of handling a great amount of data at a very high speed, however, a phase difference between the clock signals received by the units, which is caused by differences in length between the lines for the clock signal, becomes a problem. Therefore, a method is carried out in which each unit synchronizes input data in phase with its own clock signal by being provided with a bit phase synchronizing circuit for adjusting the phase of the input data.

As prior art for this purpose, for example, there is a technique disclosed in Japanese laid-open publication Tokkaihei No.4-293332. This is roughly described in the following. Input data is inputted into a first delay gate group composed of plural delay gates connected in series with one another. Said input data or output data of either delay gate is outputted as output data from the first delay gate group. The output data is inputted into a second delay gate group of two-stage delay gates. Next, it is judged at the same time controlled by a reference clock signal whether or not said inputted data and the output data of the first-stage delay gate of the second delay gate group coincide in logic level with each other, and whether or not the output data of the first-stage delay gate and the output data of the second-stage delay gate coincide in logic level with each other. According to this judgement, a bit change detecting signal is generated which shows whether or not a point of time when the output data from said first-stage delay gate changes in logic level, namely, a bit change point is within a specified time range before and after said judgement time. And in case that the input data and the reference clock signal are not synchronous with each other, in response to the bit change detecting signal, the system performs an automatic phase adjustment so as to synchronize in phase said input data with said reference clock signal by selecting another output data out of plural output data being outputted by said first delay gate group (called selected data) and sending said newly selected output data to the second delay gate group.

In the above-mentioned prior art, stability of the delay time, namely, a delay quantity or duration in each delay gate of the first delay gate group, is significant. Because if the delay quantity in each delay gate of the first delay gate group varies with the lapse of time, each delay gate of the first delay gate group cannot give a phase difference to input data an accurate and repeatable manner. The reason is that since the delay quantity in each delay gate is the minimum unit of phase difference to be adjusted, the phase adjustment resolution comes to be varied. When the phase adjustment resolution is varied, an aimed-at phase adjustment cannot be performed even if an attempt is made to adjust the phase of the input data by changing an output position in the first delay gate group according to the bit change detecting signal.

In said laid-open publication, however, there is no description about stabilization of the delay quantity in the first delay gate group. Even in case each delay gate of the first delay gate group is composed of a CMOS inverter designed so as to have a specified fixed delay quantity for the time, the delay quantity of a signal in the CMOS inverter can deviate greatly from its design value due to the chip temperature or the finished characteristics of the MOS FETs composing the chip.

In order to make a bit phase adjusting circuit with good repeatability of the phase difference, it is necessary to stabilize at least delay quantities in the first delay gate group with the lapse of time. Up to now, however, there has been no conception of suppressing such undesirable variation in the delay gates.

Accordingly, it is an object of the present invention to provide a method for attaining bit phase synchronization, and a circuit suitable for carrying out the method.

SUMMARY OF THE INVENTION

The present invention presupposes an existing method as described in the following. First, input data is inputted into a first delay gate group composed of plural delay gates connected in series with one another. According to the input data, either data is selected out of the very input data not delayed and delay data related to this input data obtained from the respective delay gates in the first delay gate group, and then the selected data is outputted.

The selected data is inputted into a second delay gate group composed of delay gates of N stages (where N is an integer satisfying $N \geq 2$). The selected data is delayed in series in the respective delay gates. Then, paying attention to three data that are different in delay quantity and that are outputted from the second delay gate group, whether or not the three output data coincide in logic level with one another is examined. That is to say, it is judged at the same time (controlled by a reference clock signal) whether or not the output data of a pth-stage delay gate (where p is an integer satisfying $1 \leq p \leq N$) and the output data of at least a (p−1)th-stage delay gate (when p=1, the (p−1)th-stage delay gate is assumed as the very input point of the second delay gate group) coincide in logic level with each other, and whether or not the output data of the pth-stage delay gate and the output data of at least a (p+1)th-stage delay gate coincide in logic level with each other. According to this judgement, a bit change detecting signal is generated which shows whether or not a change in logic level (also called a bit change) of the output data from the pth-stage delay gate has happened within a specified time before and after said judgement time.

The input data is synchronized in phase with the reference clock signal by changing the selected data being currently outputted to another selected data according to this bit change detecting signal and outputting the newly selected data.

An aspect of a bit phase synchronizing method of the invention is to control the delay gates of the first delay gate group so as to compensate for variations in the signal delay quantity or duration in each of these delay gates.

According to such a configuration as this, even if the delay quantity deviates from its design value or nominal value due to an environmental variation or the finished characteristics of a device, it is possible to keep the delay quantity constant by controlling the delay gates so as to reduce this deviation to zero or as nearly to zero as possible. Therefore, each delay gate of the first delay gate group gives a phase difference to its input data with good repeatability. Here, "constant" includes "substantially constant" (and the following is the same as this).

A second aspect of a bit phase synchronizing method of the invention is to control the delay gates of the second delay gate group so as to compensate for variations in the delay quantity in each of these delay gates also in relation to signal delay quantities in the respective delay gates of the second delay gate group.

According to such a configuration as this, since phase differences among data outputted from the (p−1)th-stage, pth-stage, and (p+1)th-stage delay gates are stabilized, a time range of detecting a bit change is made constant. Accordingly, since repeatability of a bit change detection sensitivity is secured, the bit change detecting operation can be greatly improved in reliability.

According to a preferable embodiment of the invention, variations in the delay quantity of the respective delay gates of the first and the second delay gate groups may be compensated at the same time.

The invention presupposes the following configuration of an existing bit synchronizing circuit. That is to say, an embodiment of the invention is provided with a bit phase adjusting means, a bit change detecting means, and a changeover signal generating means. The bit phase adjusting means, which is composed of plural delay gates connected in series with one another and has a first delay gate group having input data inputted into it, selects either data out of the very input data and delay data related to the input data obtained respectively from the delay gates in the first delay gate group, and outputs the selected data.

The bit change detecting means is composed of N delay gates (where N is an integer satisfying N≧2), and has a second delay gate group into which the selected data from the bit phase adjusting means is inputted. By judging at the same time controlled by a reference clock signal whether or not the output data of a pth-stage delay gate (where p is an integer satisfying 1≦p≦N) and the output data of at least the (p−1)th-stage delay gate (when p=1, the (p−1)th-stage delay gate is assumed as the very input point of the second delay gate group) coincide in logic level with each other, and whether or not the output data of the pth-stage delay gate and the output data of at least a (p+1)th-stage delay gate coincide in logic level with each other, this bit change detecting means outputs a bit change detecting signal which shows whether or not a change in logic level (also called a bit change) of the output data from the pth-stage delay gate has happened within a specified time before and after said judgement time.

The changeover signal generating means supplies to this bit phase adjusting means a changeover signal for changing over the selected data being currently outputted from the bit phase adjusting means to another selected data according to this bit change detecting signal.

According to an aspect of a bit phase synchronizing circuit of the invention, the bit phase synchronizing circuit has a first delay gate group each delay gate of which is composed of a delay gate of a delay quantity control type and is provided with a first delay quantity control means for supplying a control signal for compensating for variation of a delay quantity in the delay gate of a delay quantity control type.

According to the bit phase synchronizing circuit of the invention, since, even if the delay quantities of the respective delay gates of the first delay gate group in the bit phase synchronizing circuit vary due to variations of the ambient temperature or other causes, a control signal for suppressing the variation is supplied to the delay gate from the delay quantity control circuit, and the varied delay quantity is automatically corrected or compensated to the original delay quantity. Accordingly, each delay gate of the first delay gate group of the bit phase adjusting circuit gives a phase difference to its input data with good repeatability. Thus a bit phase synchronizing circuit can be implemented which can synchronize input data in phase with a reference clock signal of its own unit more stably than that of the prior art.

When implementing the bit phase synchronizing circuit of the invention, it is preferable that each delay gate of the second delay gate group is also composed of a delay gate of a delay quantity control type.

According to such a configuration as this, even if the delay quantities of the (p−1)th-stage, pth-stage, and (p+1)th-stage delay gates vary due to variations of the ambient temperature or other causes, their correction or compensation is automatically performed in the same way as described above. Therefore, since phase differences among data outputted from the (p−1)th-stage, pth-stage, and (p+1)th-stage delay gates are stabilized, a time range of detecting a change point is made constant Accordingly, since repeatability of a bit change detection sensitivity is secured, a bit phase synchronizing circuit of higher reliability can be implemented.

When implementing the bit phase synchronizing circuit of the invention, in case that each delay gate of a delay quantity control type is composed of a delay gate whose delay quantity is controlled by a voltage and the delay quantity control circuit is composed of a PLL (phase locked loop) circuit, an accurate delay quantity control technique using a PLL technique can be utilized. As publicly known, a PLL circuit detects a phase difference between an input signal and an output signal and inputs a control voltage for making this phase difference zero into a voltage control oscillator. Variations of the delay quantity in a delay gate can be compensated for by supplying this control voltage to the delay gate.

Particularly, in case of making each delay gate of the first and the second delay gate group have the same circuit and layout configuration as a delay gate provided in the voltage control oscillator of said PLL circuit, since the same control as that of the delay gate in the PLL circuit can be applied to each delay gate of the first and the second delay gate group, an accurate delay quantity control can be easily performed.

BRIEF DESCRIPTION OF THE DRAWINGS

The foregoing objects and other objects, features and advantages of the present invention will be better understood from the following description taken in connection with the accompanying drawings, in which.

DETAILED DESCRIPTION OF THE PREFERRED EMBODIMENTS

With reference to the drawings, preferred embodiments of a bit phase synchronizing method and a bit phase synchronizing circuit of the present invention are described in the following.

The drawings used in the description are shown schematically roughly to some degree to facilitate understanding of the invention. The same numbers are attached to the same components in the respective drawings, and their duplicate description is sometimes omitted.

1. First Embodiment

As a first embodiment, an example is described in which each delay gate of a first delay gate group is composed of a delay gate whose delay quantity or duration is controlled by a voltage and a delay quantity control circuit is composed of a PLL circuit.

1-1. Description of the Circuit Configuration

Figure 1:
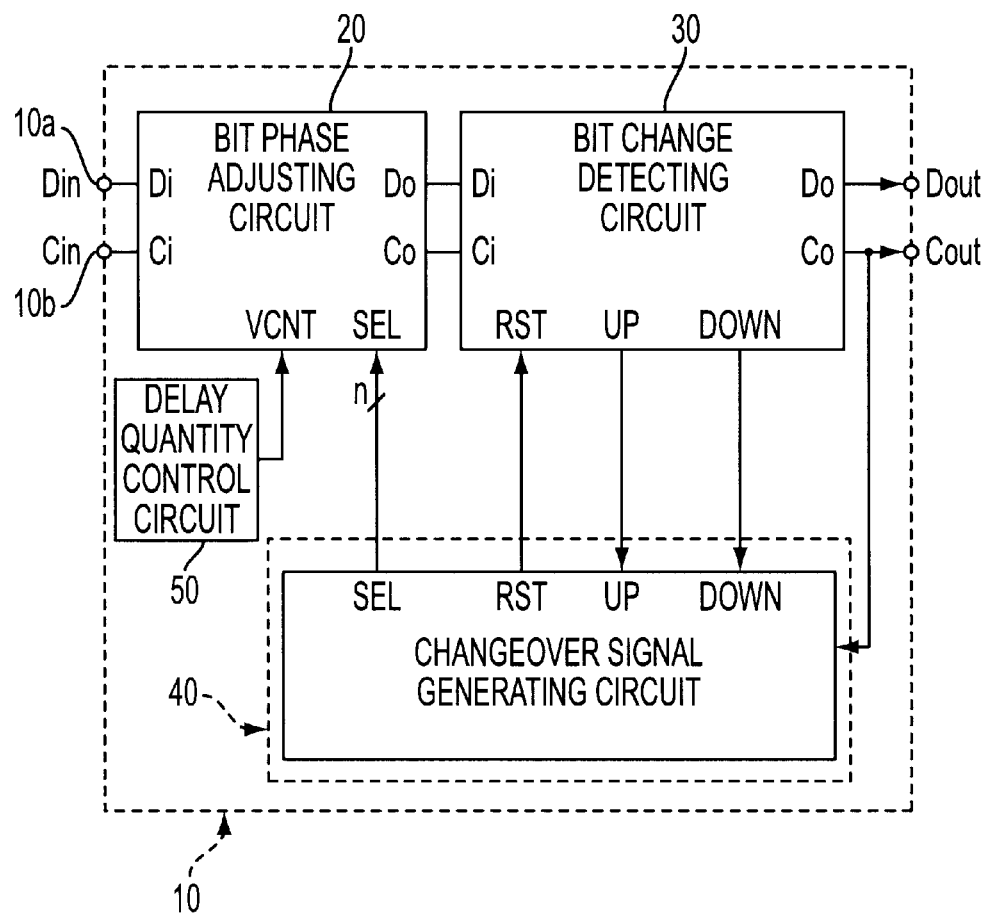
FIG. 1 is a block diagram showing the whole configuration of a bit phase synchronizing circuit of the present invention.
Figure 2:
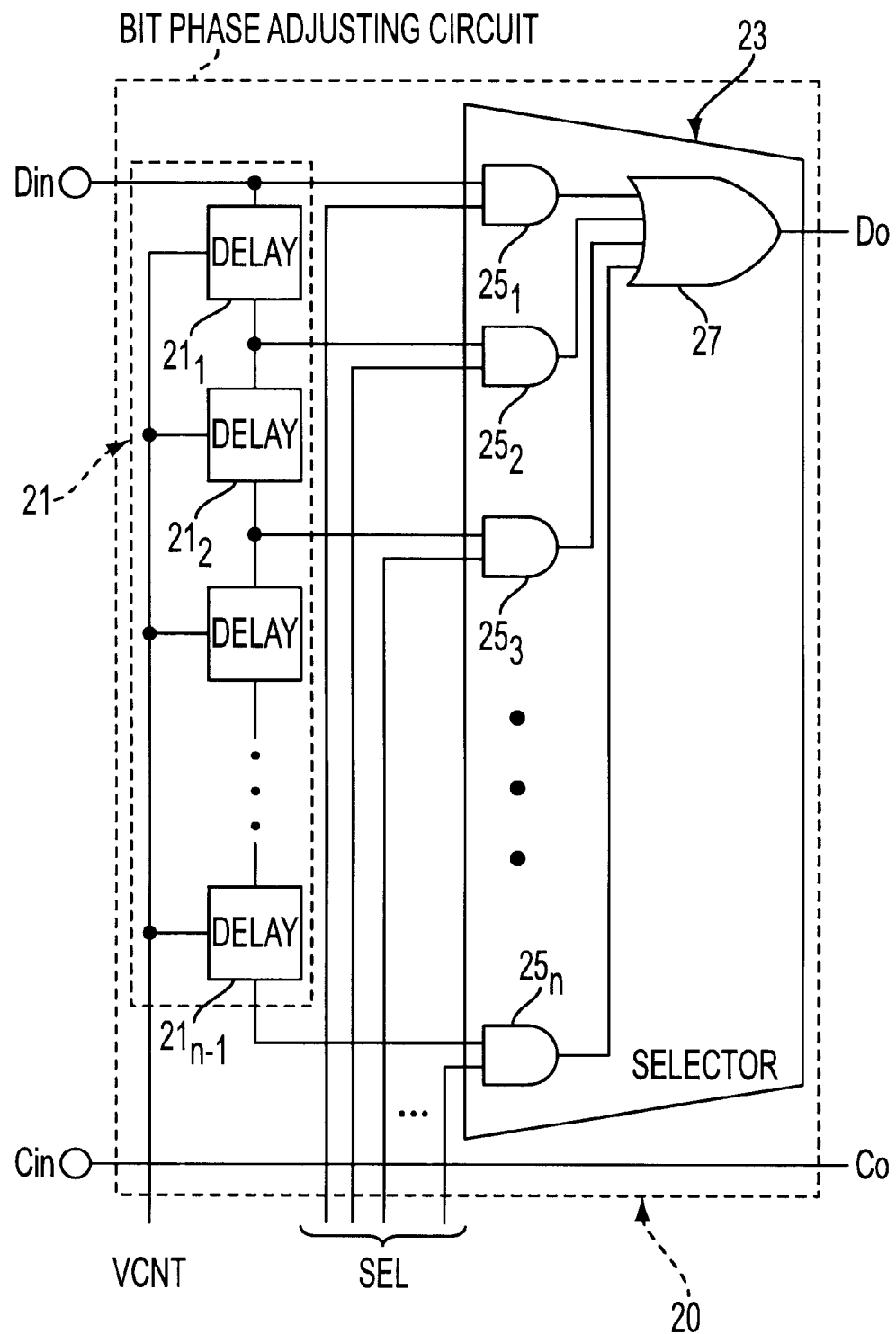
FIG. 2 is a block diagram for explaining a bit phase adjusting circuit in the bit phase synchronizing circuit of the invention.
Figure 3:
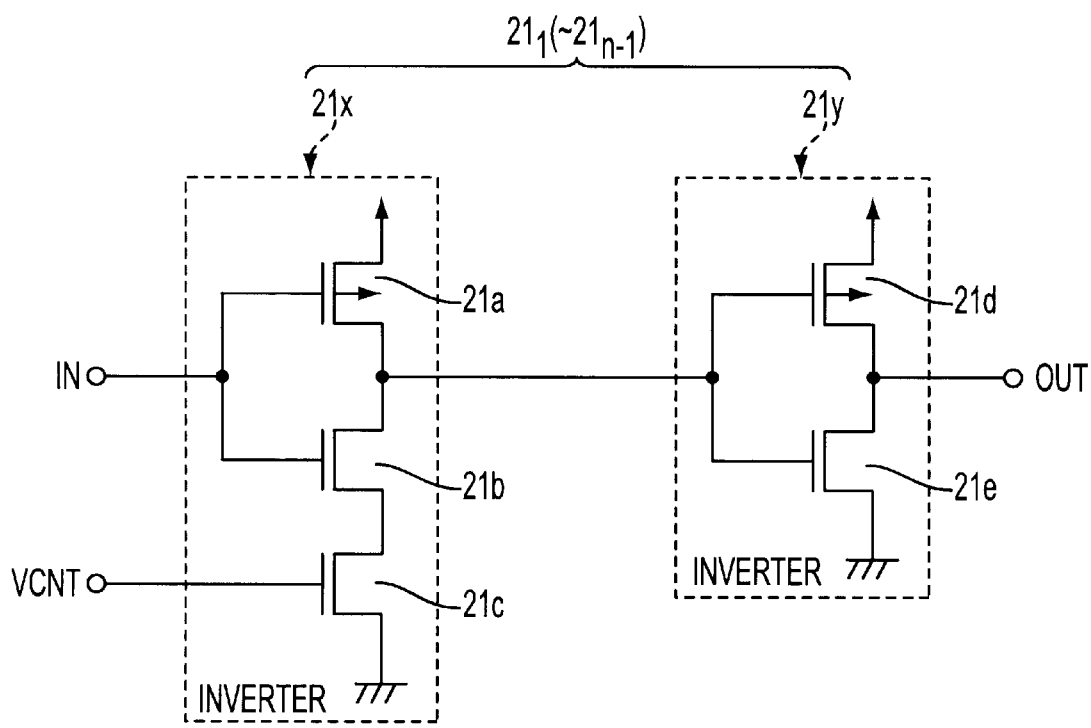
FIG. 3 is a circuit diagram for explaining a delay gate of a delay quantity control type.
Figure 4:
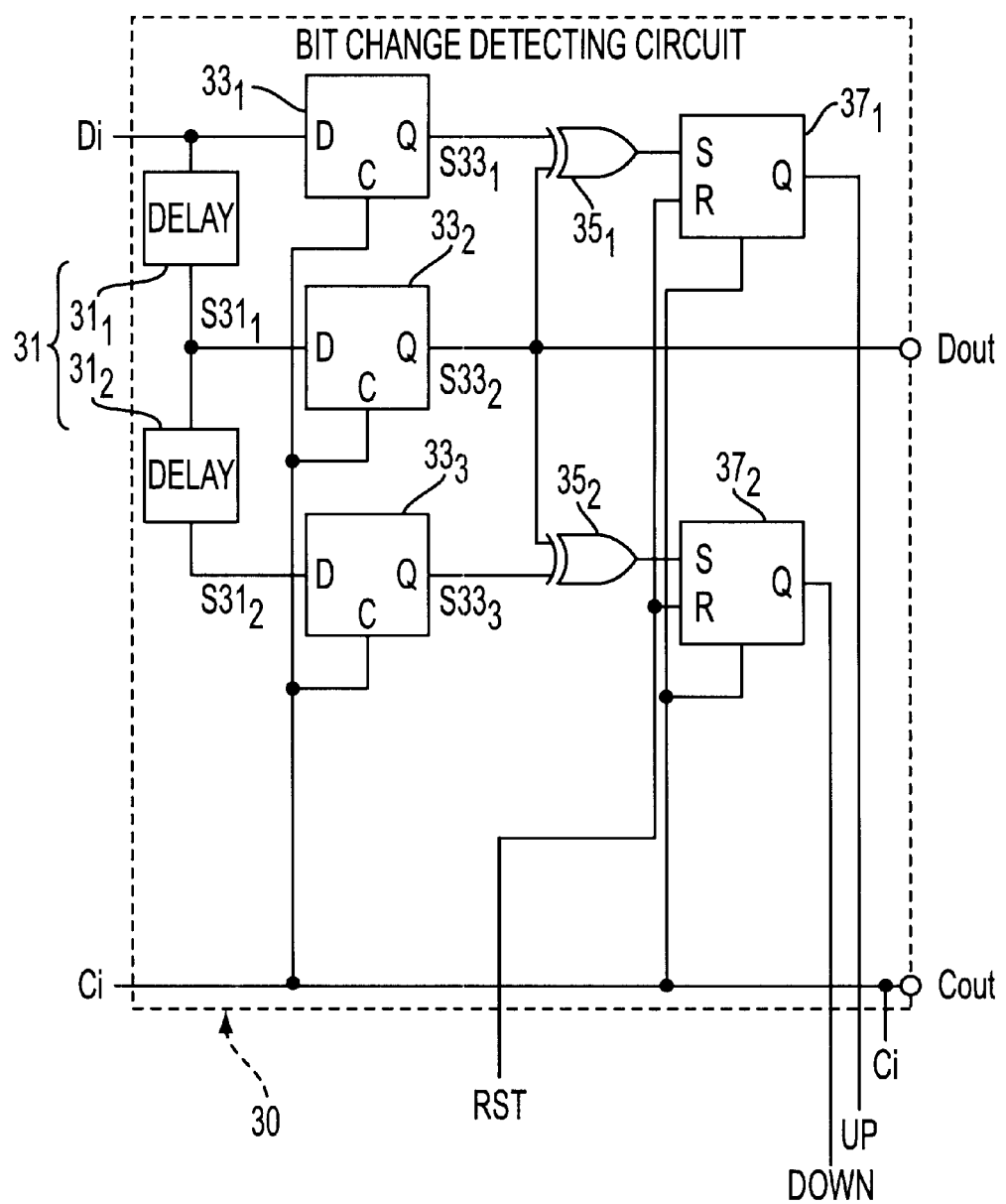
FIG. 4 is a block diagram for explaining a bit change detecting circuit in the bit phase synchronizing circuit of the invention.
Figure 5:
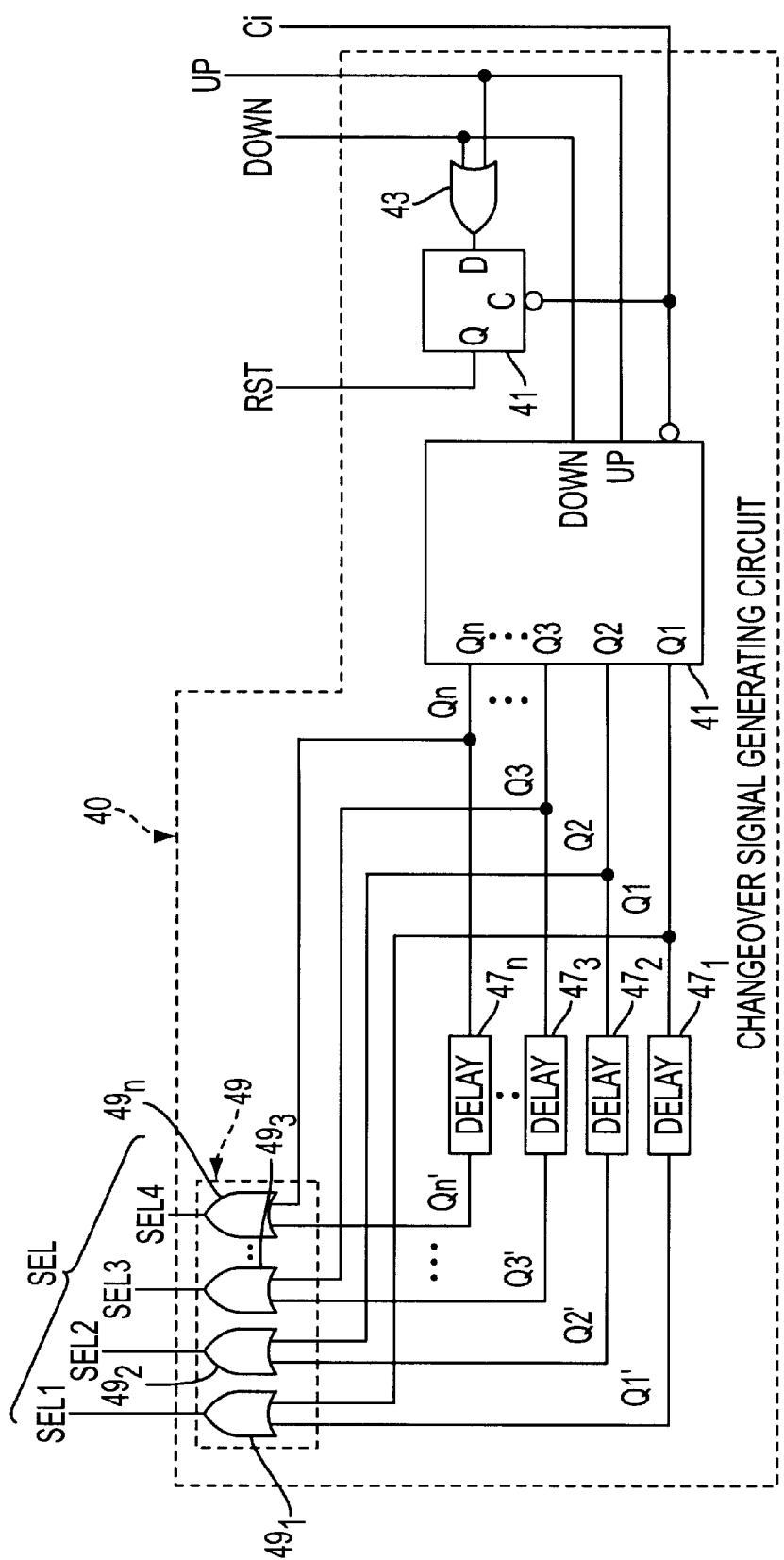
FIG. 5 is a block diagram for explaining a changeover signal generating circuit, namely, a bit phase control circuit in the bit phase synchronizing circuit of the invention.
Figure 6:
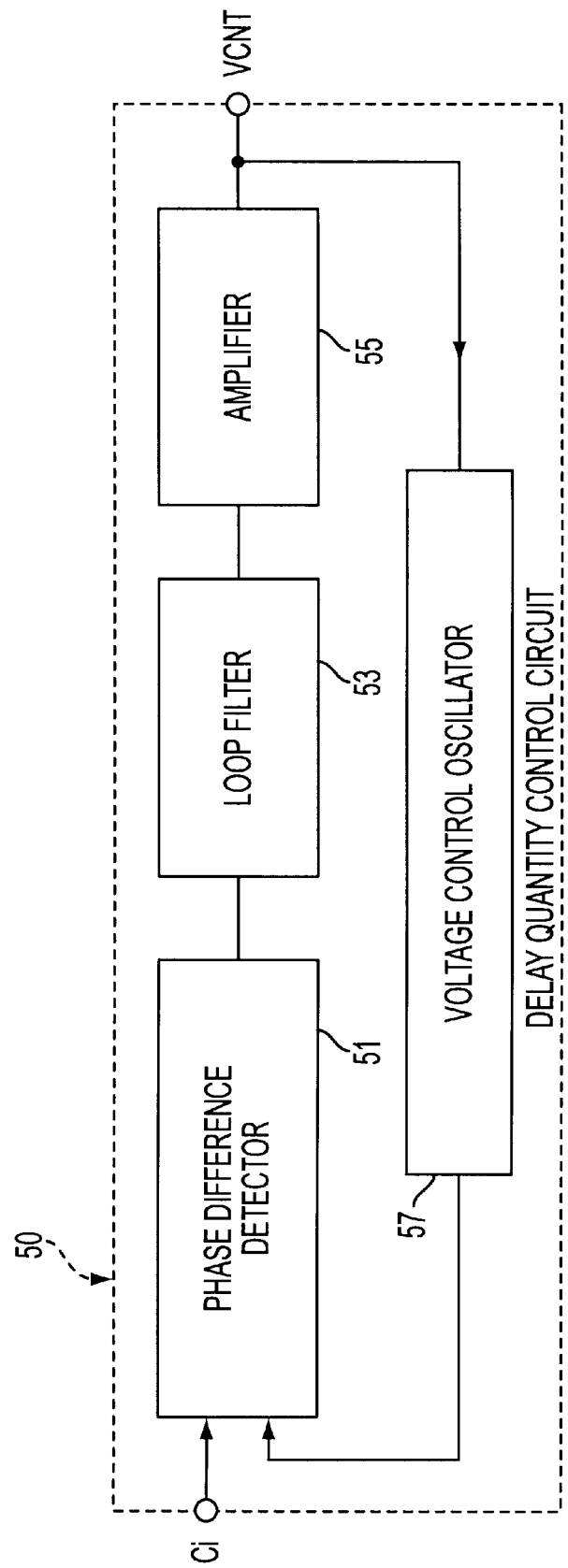
FIG. 6 is a block diagram for explaining a delay quantity control circuit provided in the bit phase synchronizing circuit of the invention.
Figure 7:
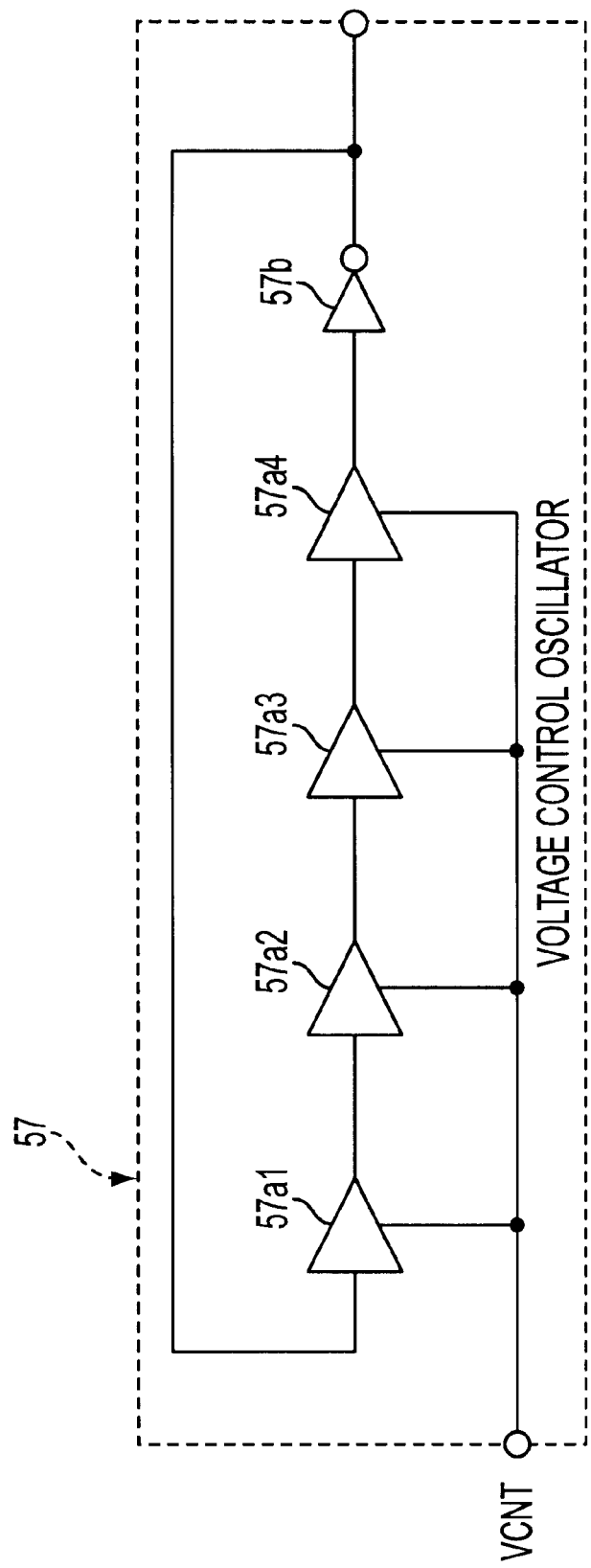
FIG. 7 is a block diagram for explaining a voltage control oscillator provided in the delay quantity control circuit.

First, an example of the circuit configuration of a bit phase synchronizing circuit 10 which the present invention is applied to is described with reference to FIGS. 1 to 7. FIG. 1 is a block diagram showing the whole configuration of the bit phase synchronizing circuit 10 of the first embodiment of the invention. FIG. 2 is a circuit diagram of a bit phase adjusting circuit 20 provided in the bit phase synchronizing circuit 10. FIG. 3 is a circuit diagram of each delay gate of a first delay gate group 21 provided in the bit phase adjusting circuit 20. FIG. 4 is a circuit diagram showing the circuit configuration of a bit change detecting circuit 30 provided in the bit phase synchronizing circuit 10. FIG. 5 is a circuit diagram showing the circuit configuration of a changeover signal generating circuit 40 provided in the bit phase synchronizing circuit 10. FIG. 6 is a circuit diagram showing the circuit configuration of a delay quantity control circuit (concretely a PLL circuit) 50 provided in the bit phase synchronizing circuit 10. FIG. 7 is a circuit diagram showing an example of a voltage control oscillator 57 provided in the delay quantity control circuit 50.

In FIG. 1, which is a general view of the embodiment, number 10a is an input terminal for input data Din, number 10b is an input terminal for a high-speed reference clock signal Cin (which may be also shown as Ci), Dout is output data which has been synchronized in bit phase, and Cout is output of the reference clock signal Cin. Such symbols as Do, Di, VCNT and the like are successively explained later on. Thinking about Din and Dout in terms of a broad-band ISDN switching system as an example, input data Din is data transmitted from another unit not illustrated, and reference clock signal Cin is a high-speed reference clock signal transmitted through a line for the clock signal from an unillustrated clock source. And the bit phase synchronizing circuit 10 is a circuit which adjusts a phase difference between the input data Din and the reference clock signal Cin and properly outputs the output data Dout to the next stage. Components 20 to 50 are described in detail in the following.

First, the bit phase adjusting circuit 20 is described with reference to FIGS. 2 and 3. In this embodiment, the bit phase adjusting circuit 20 has the same composition as that of Japanese laid-open publication Tokkaihei No.4-293332 except that delay gates 21(1) to 21(n-1) are of a delay quantity control type. Concretely, the bit phase adjusting circuit 20, which outputs the very input data Din which is kept intact and data derived from the input data Din whose phase has been adjusted to the bit change detecting circuit 30, is composed of a first delay gate group 21 and a selector 23.

The first delay gate group 21 is composed of plural, namely, (n-1) delay gates $21_1$ to $21_{n-1}$ which are connected in series with one another. The input data Din is inputted into the 1st-stage delay gate $21_1$ of the first delay gate group 21. The first delay gate group 21 outputs to the selector 23 the very input data Din, namely, input data whose phase delay quantity is zero and delayed input data obtained from the respective delay gates $21_1$ to $21_{n-1}$. Naturally, therefore, the first delay gate group 21 outputs to the selector 23 n kinds of data which are different in phase from one another in the order of data of smaller to greater delay quantity.

Here, it is assumed that each of the delay gates $21_1$ to $21_{n-1}$ of the first delay gate group 21 is a delay gate which can be controlled so as to be constant in delay duration or quantity (which is called "delay gate of a delay quantity control type"). Such delay gates of a delay quantity control type $21_1$ to the $21_{n-1}$ can be composed of any circuit according to design of the bit phase synchronizing circuit. However, it is preferable for the circuit to be of a type in which its delay quantity is controlled by a voltage. The reason is that such a type has advantages that it can utilize MOS technology to make a delay gate, can comparatively easily compose a delay quantity control circuit for controlling the delay gate, and can utilize a PLL circuit (described later) as the delay quantity control circuit.

In this embodiment, an example is described which uses a PLL circuit as the delay quantity control circuit 50. Ordinarily, a PLL circuit has a voltage control oscillator composed of a ring oscillator. The ring oscillator is composed of delay gates of a voltage control type. As is publicly known, delay gates composing a ring oscillator are little varied in delay quantity in operation of the PLL circuit.

In this embodiment also, each of the delay gates $21_1$ to $21_{n-1}$ is composed of a delay gate having the same circuit and layout configuration as the delay gates in the ring oscillator. And using control voltages which control the delay gates composing the ring oscillator as control signals for the delay gates $21_1$ to $21_{n-1}$ of the delay gate group having the same circuit and layout configuration as the delay gates in the voltage control oscillator can reduce variations in the delay quantities of the delay gates $21_1$ to $21_{n-1}$.

An example of delay gates of such a type is shown in FIG. 3. Each of the delay gates $21_1$ to $21_{n-1}$ is composed of a first CMOS inverter 21x and a second CMOS inverter 21y connected in series with it. Here, the first CMOS inverter 21x is composed of a PMOS transistor 21a and an NMOS transistor 21b, and an NMOS transistor 21c (a third MOS transistor) is connected in series with the NMOS transistor 21b of this CMOS inverter. An analog control voltage VCNT (in detail described later) is inputted into a control terminal (gate) of the third transistor.

In this compositional example shown in FIG. 3, the delay gate formed by the first inverter 21x and the second inverter 21y is connected between a power source and the ground. In the first inverter 21x, the drain of the first PMOS transistor 21a is connected to the power source, the drain of the first NMOS transistor 21b is connected to the source of the first PMOS transistor 21a, the drain of the second NMOS transistor 21c is connected to the source of the transistor 21b, and the source of the transistor 21b is grounded. And a common connecting point of the gate of transistor 21a and the gate of the first NMOS transistor 21b is used as a signal input terminal IN, and the gate of the second NMOS transistor 21c is used as a terminal for a control signal.

Similarly, the second inverter 21y is provided with a second PMOS transistor 21d whose drain is connected to the power source and a third NMOS transistor 21e whose drain is connected to the source of the transistor 21d and whose source is grounded. And a common connecting point of the gate of the second PMOS transistor 21d and the gate of the third NMOS transistor 21e is connected to a common connecting point of the source of the first PMOS transistor 21a and the drain of the first NMOS transistor 21b. And a common connecting point of the source of the second PMOS transistor 21d and the drain of the third NMOS transistor 21e is used as an output terminal OUT.

In the delay gate shown in FIG. 3, the current driving capability of the third MOS transistor 21c can be adjusted by varying the control voltage inputted into the gate of said transistor 21c within a range in which said transistor 21c does not come to be off. Thus, since the whole delay quantity or delay duration of a single-stage delay gate can be controlled according to the voltage value inputted as the control signal VCNT, the delay gate explained using FIG. 3 acts as a delay gate of a delay quantity control type. Therefore, for example, when the ambient temperature (or chip temperature) of the bit phase synchronizing circuit is varied, the delay quantity of the delay gate is also varied on the basis of the characteristics of the MOS FETs, but the variation can be compensated in the delay gates $21_1$ to $21_{n-1}$ themselves. Concretely, the delay gates $21_1$ to $21_{n-1}$ of a delay quantity control type are placed in the same environment as the delay gates of the PLL circuit of the delay quantity control circuit 50. Therefore, when the chip temperature is high, the delay gates of the PLL circuit are varied in delay quantity, but a control signal VCNT of high enough voltage to compensate for the variation is supplied to the voltage control oscillator to keep the delay quantity constant. On the other hand, when the chip temperature is low, a lower voltage compared with that in the high temperature state is supplied as the control signal VCNT to the voltage control oscillator to keep the delay quantity constant. Since the control voltage VCNT is applied to each of the delay gates of the delay gate group of the present invention, each delay gate acts as a delay gate having an almost constant delay time independently of the ambient temperature or the chip temperature in the same way as a delay gate of a voltage control oscillator.

In this case, the control signal VCNT is supplied from the delay quantity control circuit 50, and the circuit 50 is described later.

The selector 23 is composed of n 2-input AND gates $25_1$ to $25_n$ and an n-input OR gate 27 having the outputs of the AND gates $25_1$ to $25_n$ as its input. The n kinds of data from the first delay gate group are inputted without duplication into respectively one input of each of the n 2-input AND gates $25_1$ to $25_n$. And n selecting signals SEL1 to SELn from the changeover signal generating circuit 40 are inputted without duplication into respectively the other input of each of the n 2-input AND gates $25_1$ to $25_n$. According to the states of the selecting signals SEL1 to SELn, the selector 23 outputs selectively one of said n kinds of data of the first delay gate group 21 as the input signal Di to the bit change detecting circuit 30.

Next, the bit change detecting circuit 30 is explained with reference to FIG. 4. In this embodiment, it is preferable to make the bit change detecting circuit 30 have the same composition as the circuit disclosed in the Japanese laid-open publication Tokkaihei No.4-293332. Concretely, the bit change detecting circuit 30 is composed of a second delay gate group 31 composed of two (N=2) delay gates $31_1$ and $31_2$, first to third flip-flop circuits (also called a latch circuits) $33_1$ to $33_3$, first and second exclusive OR gates $35_1$ and $35_2$, and first and second SR flip-flop circuit $37_1$ and $37_2$. The second delay gate group 31 outputs to the next-stage circuits $33_1$ to $33_3$ the data Di outputted from the bit phase adjusting circuit 20 and delay data $S31_1$ and $S31_2$ derived from the data Di which have been delayed in phase respectively through the delay gates $31_1$ and $31_2$. Namely, the second delay gate group 31 outputs to the next-stage circuits $33_1$ to $33_3$ three kinds of data Di, $S31_1$ and $S31_2$ which are different in phase from one another. At the same time determined by the reference clock signal Ci (for example, at the time a in FIG. 8, described later), the first latch circuit $33_1$ latches the data Di kept intact without being delayed, the second latch circuit $33_2$ latches the output data $S1_1$ of the delay gate $31_1$, and the third latch circuit $33_3$ latches the output data $S31_2$ of the delay gate $31_2$. The first exclusive OR gate $35_1$ judges whether or not the data $S33_1$ latched by the first latch circuit $33_1$ and the data $S33_2$ latched by the first latch circuit $33_2$ coincide in logic level with each other. And the second exclusive OR gate $35_2$ judges whether or not the data $S33_2$ latched by the second latch circuit $33_2$ and the data $S33_3$ latched by the third latch circuit $33_3$ coincide in logic level with each other. According to the outputs of the first and the second exclusive OR gate $35_1$ and $35_2$, the SR flip-flop $37_1$ or $37_2$ outputs an UP signal or a DOWN signal as a bit change detecting signal. Such a sequence of signal processing is publicly known, but a concrete example of it will be described so as to make it easy to understand the present invention.

The data Di latched by the first latch circuit $33_1$ is the very input data kept intact and is faster in phase than the data $S31_1$ latched by the second latch circuit $33_2$. On the other hand, the data $S31_2$ latched by the third latch circuit $33_3$ is slower in phase than the data $S31_1$. Now, it is assumed that a change of a 2-level signal from "1" to "0" or, reversely, from "0" to "1", is called "a bit change", and the point of time when this change happens is called "a change point". The phase relation of the input data Di and the signal $S31_2$ is judged on the basis of the signal $S31_1$, which is medium in phase delay in relation to the input data Di. In case that a bit change of the data $S31_1$ happens a little later than the latch time (judgement time) in the second latch circuit $33_2$ and furthermore this change happens nearly within the delay time of the delay gate $33_2$, the data $S33_2$ and $S33_1$ latched by the second and the first latch circuit $33_2$ and $33_1$ do not coincide with each other. This discordance is detected by the first exclusive OR gate $35_1$, and as the result the SR flip-flop circuit $37_1$ is set at "1" and outputs an UP signal as a backward bit change detecting signal. On the contrary, in case that a bit change of the data $S31_2$ happens a little earlier than the latch time judgement time) in the second latch circuit $33_2$ and this change happens nearly within a delay time of the delay gate $31_1$, the data $S33_2$ and $S33_3$ latched by the second and the third latch circuit $33_2$ and $33_3$ do not coincide with each other. This discordance in logic level is detected by the second exclusive OR gate $35_2$, and as the result the SR flip-flop circuit $37_2$ is set at "1" and outputs a DOWN signal as a forward bit change detecting signal. Namely, it is judged by the first and the second exclusive OR gate $35_1$ and $35_2$ whether or not a point of time when output data from the pth-stage delay gate (the 1st-stage gate $31_1$ in this example) of the second delay gate group 31 is changed from "0" to "1" or from "1" to "0" (a change point) is within a specified time range before and after said judgement time, and according to the result an UP signal or a DOWN signal is outputted as a bit change detecting signal. Either of these bit change detecting signals is transferred to the changeover signal generating circuit 40. Since the bit phase is controlled by this changeover signal, the changeover signal generating circuit is also called a bit phase control circuit.

Next, the changeover signal generating circuit (bit phase control circuit) 40 is described with reference to FIG. 5. In this embodiment, it is preferable to make the bit phase control circuit 40 have the same composition as the circuit disclosed in the Japanese laid-open publication Tokkaihei No.4-293332. The bit phase control circuit 40 of this publicly known composition is constructed so as to output a proper selecting signal (described later) to the selector 23 of the bit phase adjusting circuit 20 according to the bit change detecting signal. In this case, therefore, the bit phase control circuit 40 is composed of a ring counter 41, an OR gate 43, a flip-flop circuit 45, an n-stage delay gate group 47 composed of n delay gates $47_1$ to $47_n$, and an n-stage OR gate group 49 composed of n OR gates $49_1$ to $49_n$. Each time the above-mentioned judgement is performed, either an UP signal or a DOWN signal outputted from said bit change detecting circuit 30 is inputted into the UP terminal or the DOWN terminal of the ring counter 41 in the bit phase control circuit 40. This ring counter 41 performs a count-up operation or a count-down operation in response to the input to the UP terminal or the DOWN terminal and generates any one of n delay quantity selection control signals Q1 to Qn according to the count value. These delay quantity selection control signals Q1 to Qn are inputted, respectively, into the corresponding OR gates $49_1$ to $49_n$ together with signals Q1' to Qn' (represented by Q') obtained by being delayed through the delay gates $47_1$ to $47_n$ which are connected in parallel with output terminals for the delay quantity control signals Q1 to Qn (represented by Q) of the ring counter 41. And signals outputted from these OR gates $49_1$ to $49_n$ are the selecting signals SEL1 to SELn (represented by SEL) that are inputted into the AND gates $25_1$ to $25_n$ of the selector 23 provided in the phase bit adjusting circuit 20.

The selecting signals SEL1 to SELn are signals obtained by overlapping the delay quantity selection control signals Q1 to Qn, which vary according to the bit change detecting signal, and the signals Q1' to Qn' obtained by delaying the signals Q1 to Qn by a specified time through the OR gates $49_1$ to $49_n$. Therefore, at the very point of time when a value of the delay quantity selection control signal Q is changed over, for example, from Q1 to Q2 in response to a bit change detecting signal, a delayed signal Q1' of the signal Q1 has been inputted into the OR gate $49_1$. Accordingly, if the signal Q1 is stopped for a moment when the value Q is changed over from Q1 to Q2, the selecting signal SEL has a value of the signal Q1' for this moment. After output of the ring counter has become Q2, the selecting signal SEL becomes "SEL=Q1'+Q2", and after output of the delay gate $47_2$ has become Q2', since Q1' has disappeared, and the signal SEL becomes "SEL=Q2". According to the above-mentioned composition, therefore, if the delay quantity selection control signal Q is stopped for a moment, the bit phase adjusting circuit 20 can consecutively output data without intermittence. In this case, even when the signal SEL becomes "SEL=Q1'+Q2" and the selector 23 has outputted two signals, there is no problem in operation if the signal SEL has become "SEL=Q2" at the latch time in the bit change detecting circuit 30.

Next, the delay quantity control circuit 50 provided by the present invention is described. The delay quantity control circuit 50 is not limited in substance; the only requirement is that it can provide control signals capable of making constant delay quantities in the delay gates $21_1$ to $21_{n-1}$ of a delay quantity control type to these delay gates. In this case, however, this circuit is composed as described in the following with reference to FIGS. 6 and 7.

As shown in FIG. 6, the delay quantity control circuit 50 of this embodiment is preferably composed of a publicly known circuit called a PLL (phase locked loop) circuit which is composed of a phase difference detector 51 comparing in phase a specified clock signal (here, the high-speed reference clock signal Ci) and a signal from a voltage control oscillator 57 with each other, a loop filter 53 taking the output of the phase difference detector 51 as its input, an amplifier 55 for supplying a direct current control signal to the voltage control oscillator 57 on the basis of the output of the loop filter 53, and the voltage control oscillator (VCO) 57 connected between the amplifier 55 and the phase difference detector 51. The voltage control oscillator 57 provided in the PLL circuit 50 is composed of a ring oscillator in which an odd number of inverter gates are connected in a series circuit having a plurality of gates to form a ring. Concretely, as shown in FIG. 7 for example, the oscillator 57 is composed of delay gates of a delay quantity control type $57a1$ to $57a4$ in a series circuit which includes an inverter gate $57b$. The delay gates of a delay quantity control type $57a1$ to $57a4$ have the same composition as that of the delay gate already described using FIG. 3.

As explained already, since the PLL circuit 50 using the voltage control oscillator 57 is autonomously feedback-controlled so as to oscillate always at the same frequency as a specified clock signal (here, the reference clock signal Ci) independently of the ambient temperature or the chip temperature, each of the delay quantities of the delay gates of a delay quantity control type $57a1$ to $57a4$ in the voltage control oscillator 57 is controlled so as to be kept nearly constant independently of the ambient temperature or the chip temperature. This control is performed by supplying to the control terminals of the delay gates $57a1$ to $57a4$, respectively, the control voltages VCNT capable of making the delay quantities of the delay gates $57a1$ to $57a4$ constantly independently of the ambient temperature or the chip temperature.

In this embodiment, first, the delay gates $21_1$ to $21_n$ of the first delay gate group 21 are composed as the same circuit and layout configuration as the delay gates $57a1$ to $57a4$ of the ring oscillator of the PLL circuit explained in FIG. 7. And the delay quantities of these delay gates $21_1$ to $21_n$ can be made constant (stabilized) by inputting the control voltages VCNT into the delay gates $21_1$ to $21_n$. Since the principle of operation of a PLL circuit of such a type is described in detail, for example, in "Analog Integrated Circuit Design Technology for VLSI-Vol.2" by P. R. Grey and R. G. Mayer, translated and supervised by Minoru Nagata, published by Baifuukan, pp.183 to 209, more description is omitted. Although it is a matter of course that a specified clock signal to be used in the PLL circuit may be a clock signal other than said reference signal clock Ci, the use of the clock signal Ci brings an effect that it dispenses with an additional clock.

1-2. Description of Operation

Figure 8:
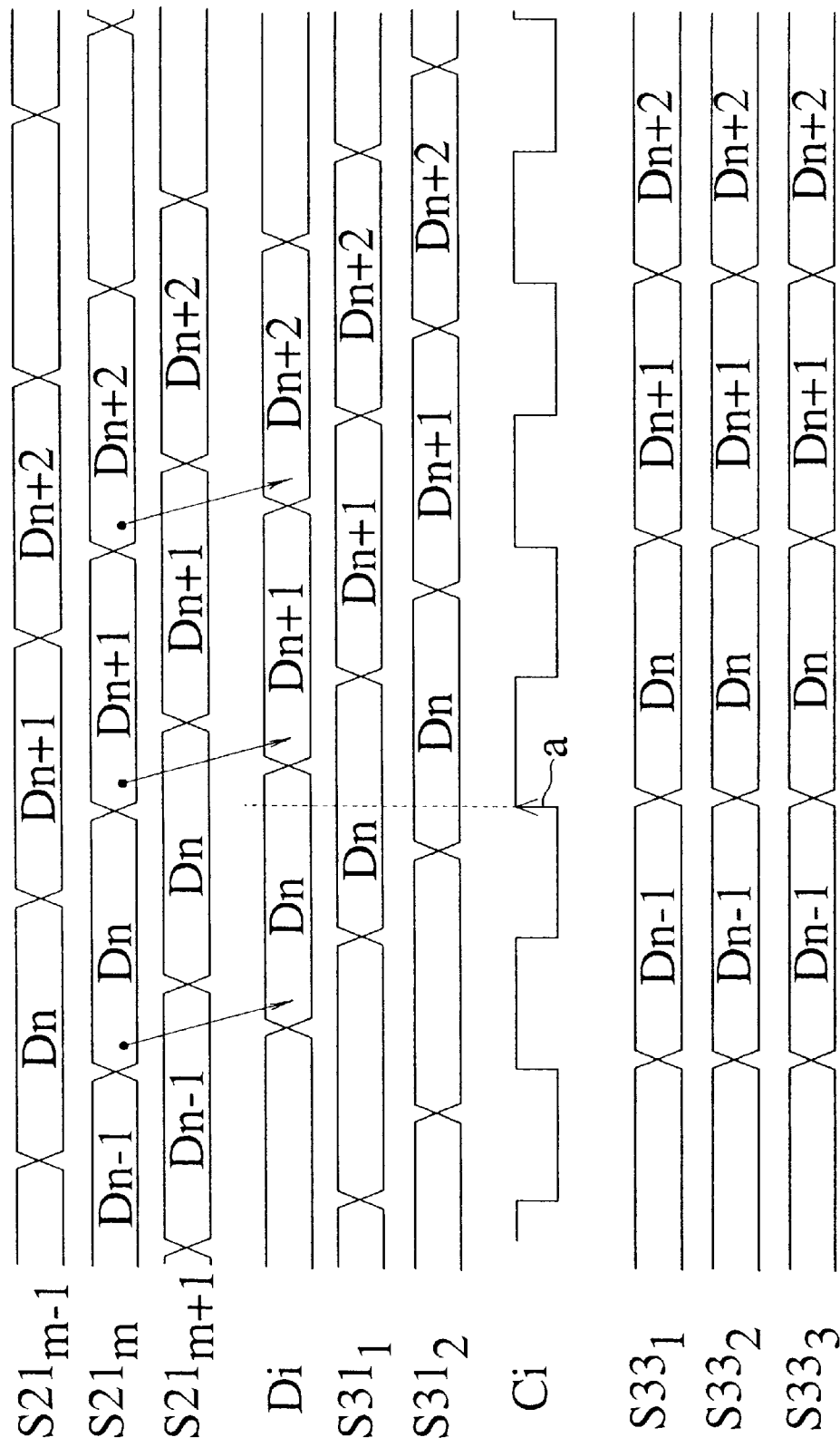
FIG. 8 is a timing chart for explaining an example of a bit phase synchronizing method of the invention.
Figure 9:
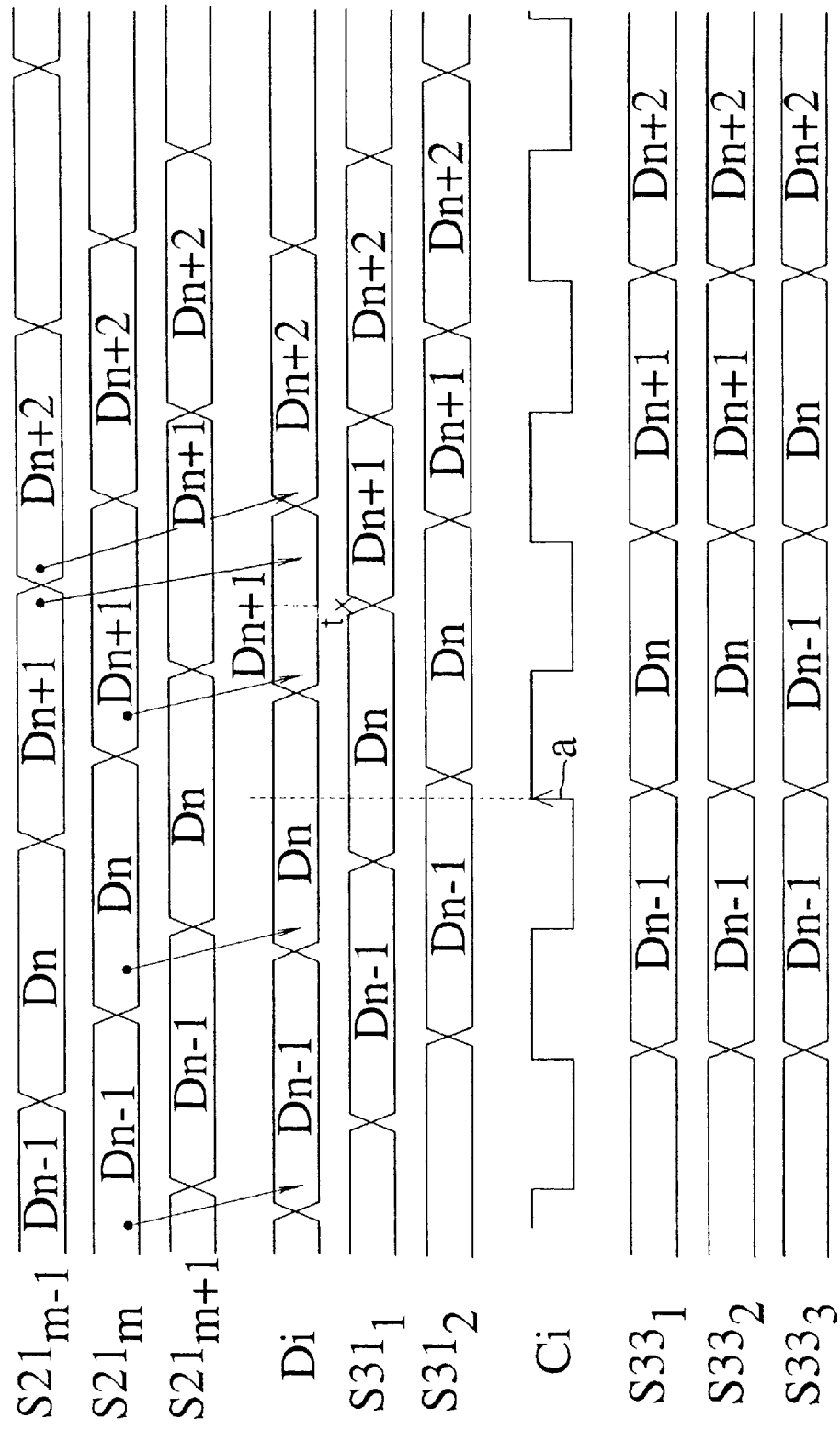
FIG. 9 is a timing chart for explaining another example of the bit phase synchronizing method of the invention.
Figure 10:
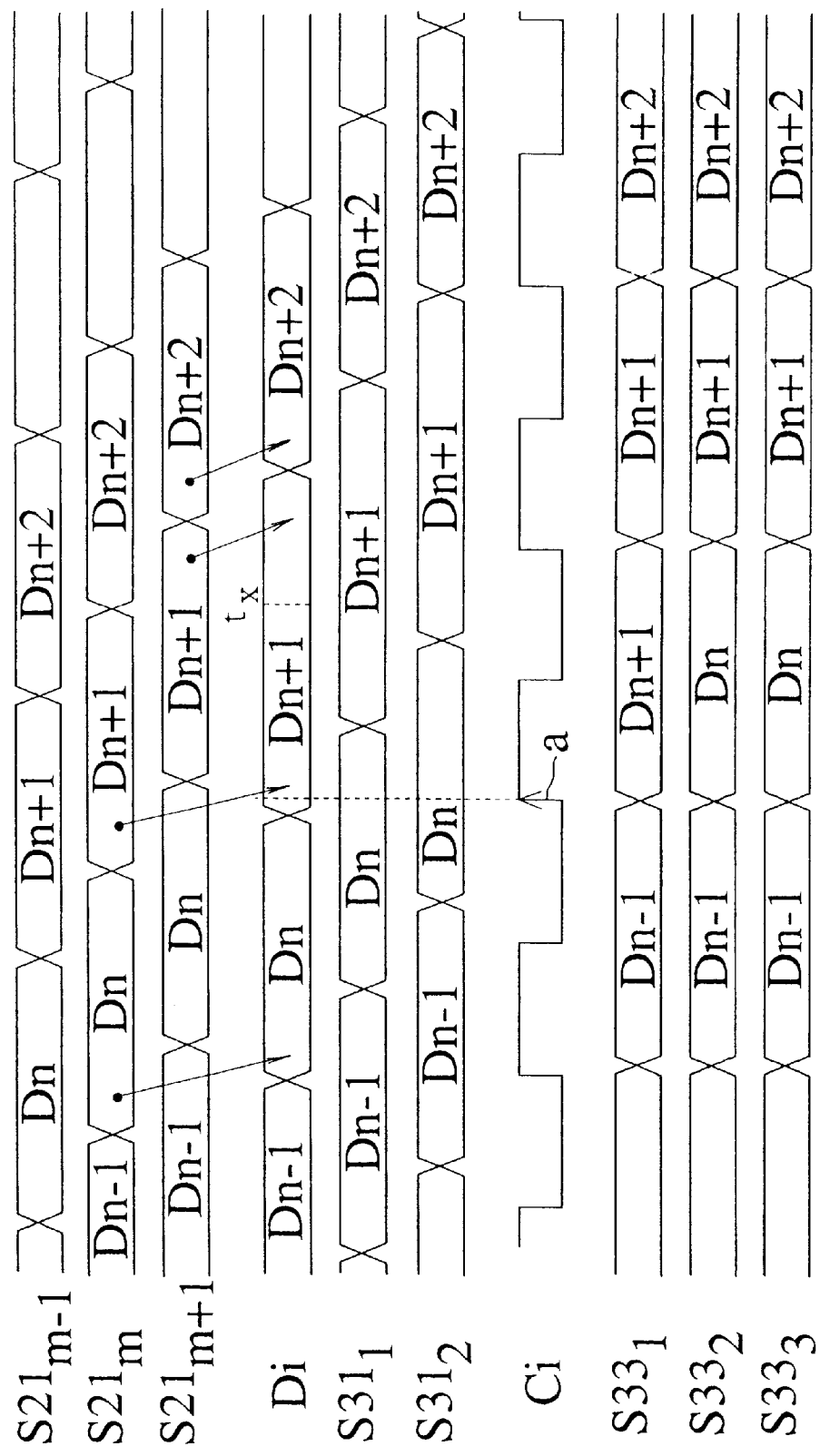
FIG. 10 is a timing chart for explaining a third example of the bit phase synchronizing method of the invention.

The bit phase synchronizing operation of the bit phase synchronizing circuit 10 of the first embodiment is described in the following with reference to FIGS. 8 to 10. FIGS. 8 to 10 are timing charts showing operation of the bit phase synchronizing circuit 10, laying stress on the above-mentioned bit change detecting operation. It is assumed that $S21_{m-1}$, $S21_m$, and $S21_{m+1}$ in FIGS. 8 to 10 are output signals from three consecutive delay gates in FIG. 2, and $S33_1$, $S33_2$, and $S33_3$ represent output signals latched and outputted by the latch circuits shown in FIG. 4.

First, a case is considered in which the bit phase adjusting circuit 20 selects and outputs data $S21_m$ from a delay gate (the 1st-stage delay gate $21_1$ in FIG. 2) of the first delay gate group (see FIG. 2). This data $S21_m$ is inputted into the bit change detecting circuit 30 as a signal Di. This Di is inputted directly into the first latch circuit $33_1$, inputted into the second latch circuit $33_2$ as data $S31_1$ through the 1st-stage delay gate $31_1$, and inputted into the third latch circuit $33_3$ as data $S31_2$ through the two delay gates $31_1$ and $33_2$. These latch circuits are called flip-flop circuits, and in this case, in particular, the second latch circuit is called a reference flip-flop circuit as it provides a reference for a phase judgement and the data $S31_1$ is called reference data.

FIG. 8 shows an example in which the data Di, $S31_1$, and $S31_2$ are latched at a rising edge of the clock signal Ci (a point of time represented by a in FIG. 8), and the latch time is relatively far from bit-change points of time when, and nearly in the middle of the respective data the data latch operation is performed. In this case, both of the data Di and the data $S31_2$, respectively, that are latched by the first latch circuit $33_1$ and the third latch circuit $33_3$ at the rising edge of the clock signal Ci have the same value as the data S31of the reference data (its bit value is either of "1" or "0"). All of the latch circuits $33_1$, $33_2$, and $33_3$ latch the same data Dn at the rising edge a of the clock signal Ci. In this case, since the reference flip-flop circuit $33_2$ has latched the data in a sufficiently stable state, the bit change detecting circuit 30 does not output a bit change detecting signal (UP signal or DOWN signal), and so the bit phase control circuit 40 keeps the delay quantity selection signal in the current state.

An example shown in FIG. 9 shows a case where, since the input data Din into the bit phase adjusting circuit 20 has come to deviate in phase from the reference clock signal Ci when the circuit 20 is outputting the data $S21_m$, a bit change of the input data $S31_1$ has come a little ahead of the rising edge (latch time) a of the clock signal Ci. Here, paying attention to the rising edge a of the clock signal Ci, the data $S31_1$ of the reference data and the data Di that is faster in phase than this data $S31_1$ have the same data Dn, but the data $S31_2$ that is slowest in phase has a value Dn−1 one cycle before Dn at the time a. In this case, therefore, since the output data $S33_2$ of the second latch circuit $33_2$ and the output data $S33_3$ of the third latch circuit $33_3$ do not coincide in logic level (bit value) with each other, the bit change detecting circuit 30 outputs a DOWN signal. The bit phase control circuit 40 which has received this DOWN signal outputs a selection control signal SEL so as to select and outputs the data $S21_{m-1}$ which has been decreased in delay quantity by one step.

That is to say, up to now, the ring counter 41 shown in FIG. 5 has formed an output which sets Q2 out of its output terminals as "1". Thus the SEL2 signal has been "1". As a result, the AND gate $25_2$ shown in FIG. 2 has become effective and the signal $S21_m$ has been outputted as Di. However, since a DOWN signal has been outputted, the ring counter 41 outputs a signal which sets Q1 out of its output terminals as "1". Thus, since the SEL1 signal becomes "1", at this time the AND gate $25_1$ in FIG. 2 becomes effective.

By this, the bit phase adjusting circuit 20 comes to output the data $S21_{m-1}$ to the bit change detecting circuit 30 (at a time tx in FIG. 9). Thereupon, since the data $S33_1$ to be inputted into the reference flip-flop circuit $33_2$ goes faster in phase, the latch time comes to be at a position where the data is sufficiently stable.

An example shown in FIG. 10 shows a case where, since the input data Din has come to deviate (go fast) in phase from the reference clock signal Ci when the circuit 20 is outputting the data $S21_m$, a bit change of the input data $S31_1$ has come a little behind a rising edge of the clock signal Ci. In this case, since the data $S31_1$ of the reference data and the data Di that is faster in phase do not coincide in logic level (bit value) with each other at the latch time, the bit change detecting circuit 30 outputs an UP signal. The bit phase control circuit 40 outputs a selection control signal SEL so as to select the data which has been increased in delay quantity by one step.

That is to say, the ring counter 41 (see FIG. 5) changes its output so as to set Q3 as "1". Thus, since the SEL3 signal becomes "1", at this time the AND gate $25_3$ shown in FIG. 2 becomes effective.

By this, the bit phase adjusting circuit 20 comes to output the data $S21_{m+1}$ to the bit change detecting circuit 30 (at a time tx in FIG. 10). Thereupon, since the data $S33_1$ to be inputted into the reference flip-flop circuit $33_2$ slower in phase, the latch time is adjusted so as to come to a position where the data is sufficiently stable.

By the way, as described above, in this bit phase synchronizing circuit 10, the respective delay quantities in the delay gates $21_1$ to $21_{n-1}$ determine a control resolution of the bit phase synchronizing circuit. The delay quantities are sometimes deviated from a specified design value due to some causes, and so the control resolution does not come to be determined. Thereupon, the present invention controls the delay gates $21_1$ to $21_{n-1}$ of the first delay gate group 21 so that the delay quantities can be kept always constant by compensating for variation in the delay quantity when the delay gates vary in delay quantity. Since such control can suppress a phase control resolution to be varied due to, for example, variation of temperature and the like, the desired circuit operation can be easily guaranteed. Particularly, in a bit phase synchronizing circuit which handles high-speed input signals, although a design margin for timing is very small, the design margin can be expanded by reducing variation in the delay quantity of a delay gate caused by variation of temperature by means of this method. It is a matter of course that variation of delay quantities in the delay gates $21_1$ to $21_{n-1}$ caused by variation of the power source voltage can be also suppressed.

2. Second Embodiment

Figure 11:
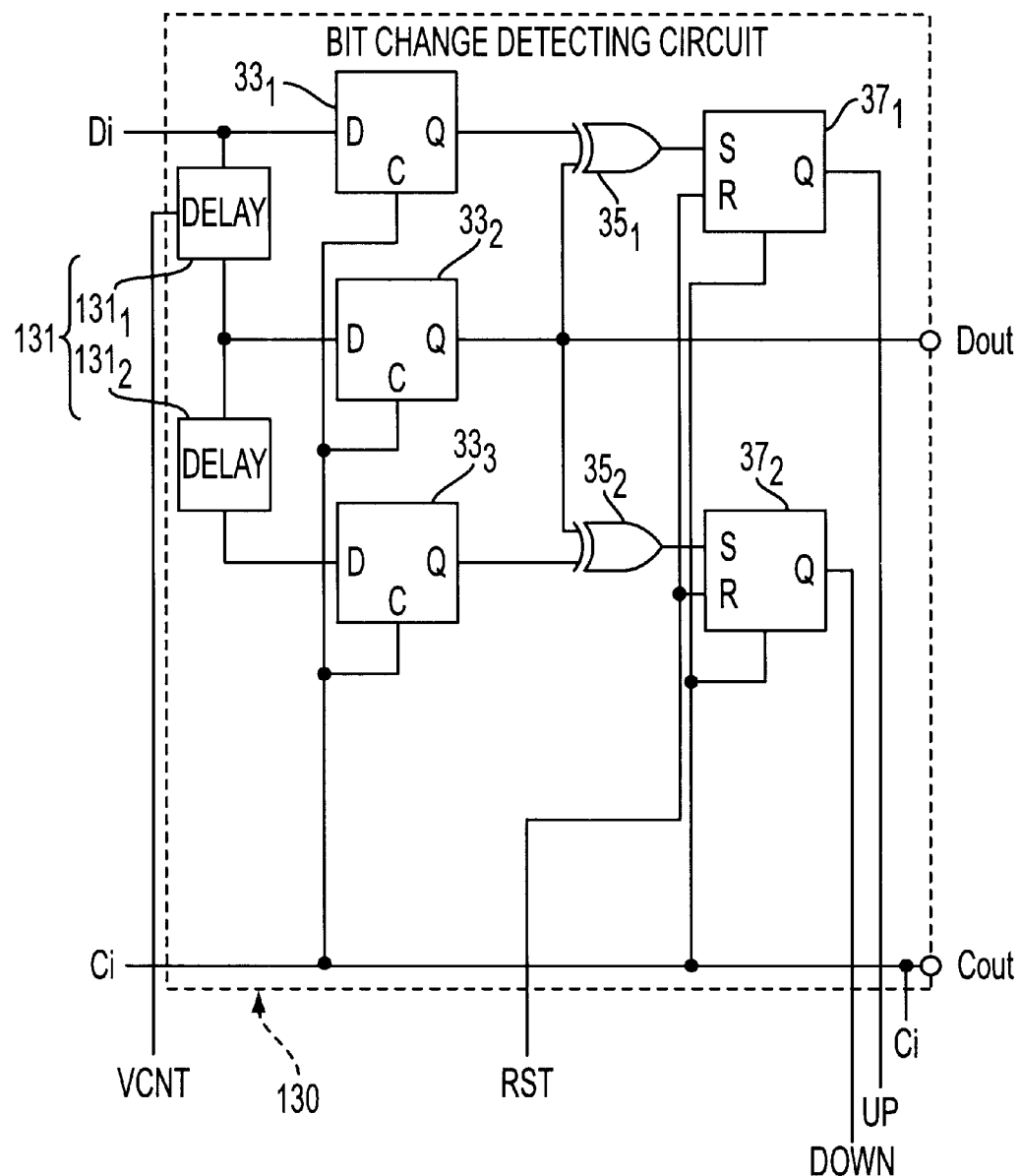
FIG. 11 is a circuit diagram for explaining another embodiment of the bit phase synchronizing method of the invention and explaining an example of making constant a delay quantity in each delay gate of the second delay gate group also.

In the above-mentioned first embodiment, the delay gates $31_1$ to $31_3$ of the second delay gate group 31 provided in the bit change detecting circuit 30 are not limited to a delay quantity control type. However, in case that each of these delay gates $31_1$ to $31_3$ is composed of an ordinary fixed type delay gate, a problem happens. For example, even if the bit change detecting circuit 30 has been designed so as to obtain an optimal detection sensitivity at room temperature, the delay quantity of a delay gate may increase due to some rise of the ambient temperature or the chip temperature in practical use and the detection sensitivity deteriorates. In the second embodiment, a technique to counter this problem is disclosed. FIG. 11 is a drawing for explaining the technique and shows the composition of a bit change detecting circuit 130 of the second embodiment.

The bit change detecting circuit 130 of the second embodiment is different from the first embodiment in that the delay gates $31_1$ and $31_2$ in the bit change detecting circuit 30 explained using FIG. 4 are replaced with the delay gates $21_1$ and $21_2$ of a delay quantity control type explained using FIG. 3 (represented by $131_1$ and $131_2$ in FIG. 11), and the control signal VCNT of the delay quantity control circuit 50 is inputted to the control terminals of the delay gates $131_1$ and $131_2$ (the gate of the third transistor 21c in FIG. 3).

In this manner, since variation of the delay quantities in the delay gates $131_1$ and $131_2$ in the bit change detecting circuit caused by variation of the ambient temperature or the chip temperature can be suppressed for the same reason as explained in the first embodiment, the respective delay quantities in the delay gates $131_1$ and $131_2$ can be stabilized. Accordingly, stable operation of the bit change detecting circuit is secured.

3. Third Embodiment

Figure 12:
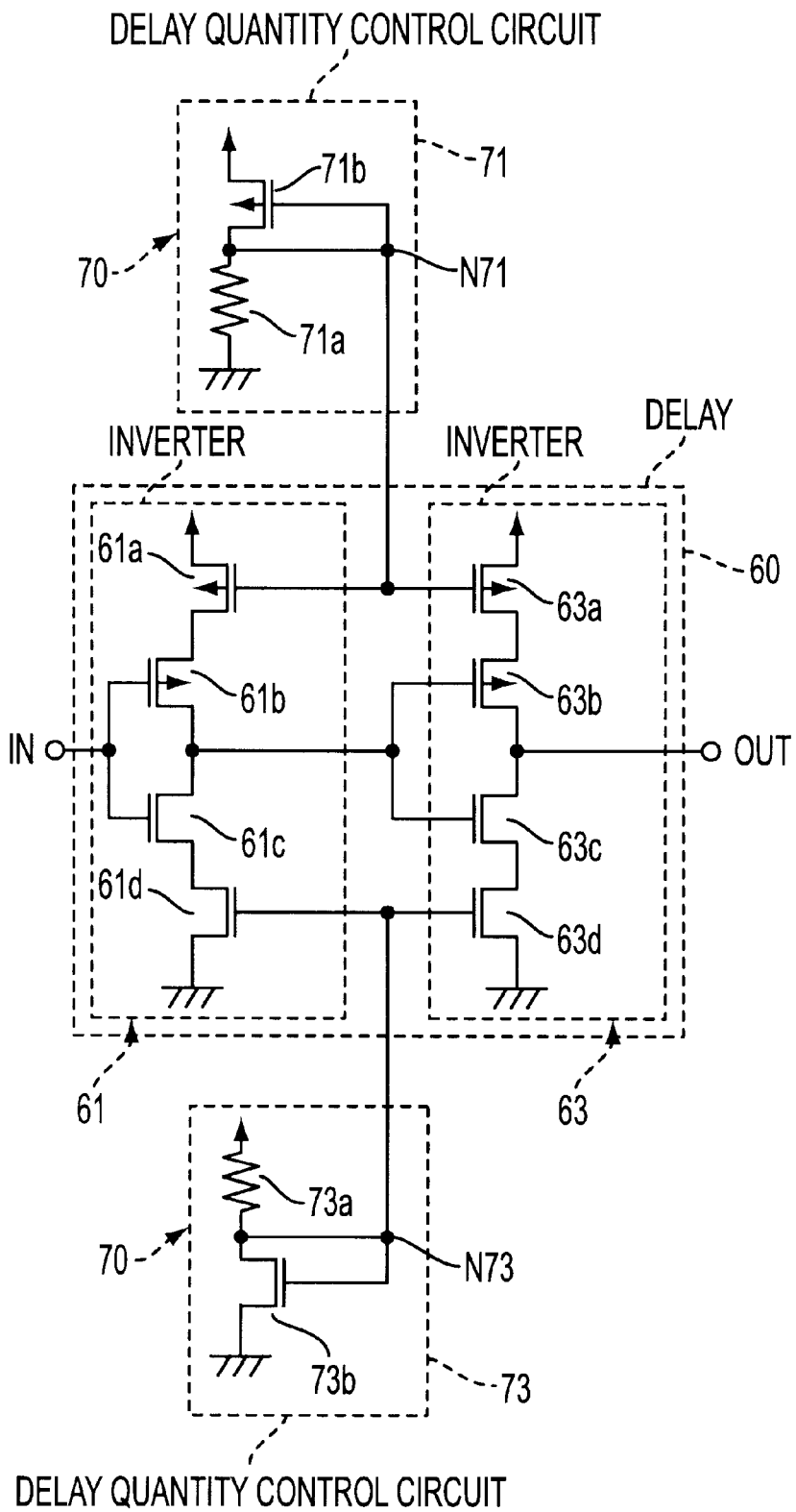
FIG. 12 is a circuit diagram showing another example of a delay gate and a delay quantity control circuit which are used in the bit phase synchronizing circuit of the invention.

In the above-mentioned first and second embodiments, examples were explained which use the delay gates shown in FIG. 3 as delay gates of a delay quantity control type and which use a PLL circuit as a delay quantity control circuit. According to them, the delay quantities in the delay gates of the first delay gate group 21 (see FIG. 2) and the second delay gate group 31 (see FIG. 4) can be stabilized with high accuracy. However, in case that it will do that stabilization of the delay quantity is merely attained to some degree, the composition of the delay quantity control circuit can be made simpler. In the third embodiment, an example of this is described. This description is made with reference to FIG. 12.

In the third embodiment, a delay gate of a delay quantity control type 60 used in a first delay gate group and/or a second delay gate group is composed of a third inverter 61 and a fourth inverter 63 connected in series to the third inverter 61. The third inverter 61 is an inverter in which a P-channel type MOS FET 61a, a P-channel type MOS FET 61b, an N-channel type MOS FET 61c, and an N-channel type MOS FET 61d are connected in series with one another, and the gates of the MOS FETs 61b and 61c are used for the input of the delay gate 60 and a connecting point of the source and the drain, respectively, of the MOS FETs 61b and 61c is used as output of the fourth inverter 63. Describing in detail the third inverter 61, this inverter 61 is provided with the third PMOS transistor 61a whose drain is connected to a power source, the first PMOS transistor 61b whose drain is connected to the source of the transistor 61a, the first NMOS transistor 61c whose drain is connected to the source of the transistor 61b, and the second NMOS transistor 61d whose drain is connected to the source of the transistor 61c and whose source is grounded. And a common connecting point of the gate of the first PMOS transistor 61b and the gate of the first NMOS transistor 61c is used as the signal input terminal.

The fourth inverter 63 is an inverter in which a P-channel type MOS FET 63a, a P-channel type MOS FET 63b, an N-channel type MOS FET 63c, and an N-channel type MOS FET 63d are connected in series with one another, and the gates of the MOS FETs 63b and 63c are connected to the output of the third inverter. A connecting point of the source and the drain, respectively, of the MOS FETs 63b and 63c is used as the output of the delay gate 60. Describing in detail the fourth inverter 63, this inverter 63 is provided with the fourth PMOS transistor 63a whose drain is connected to the power source, the second PMOS transistor 63b whose drain is connected to the source of the transistor 63a, the third NMOS transistor 63c whose drain is connected to the source of the transistor 63b, and the fourth NMOS transistor 63d whose drain is connected to the source of the transistor 63c and whose source is grounded. And a common connecting point of the gate of the second PMOS transistor 63b and the gate of the third NMOS transistor 63c is connected to a connecting point of the source of the first PMOS transistor 61b and the drain of the first NMOS transistor 61c. And the gates of the third and fourth PMOS transistor are connected to each other, and the gates of the second and the fourth NMOS transistor are connected to each other. And a connecting point of the source of the second PMOS transistor and the drain of the third NMOS transistor is used as a signal output terminal.

In this case, a delay quantity control circuit 70 is composed of a PMOS side delay quantity control circuit 71 as a first delay quantity control circuit and an NMOS side delay quantity control circuit 73 as a second delay quantity control circuit. The PMOS side delay quantity control circuit 71 is composed of a first resistor means 71a having a negative temperature coefficient and a P-channel type MOS FET (a fifth PMOS FET) 71b whose drain and gate are connected with one end of the resistor means 71a and whose source is connected with a power source. The other end of the resistor means 71a is grounded. On the other hand, the NMOS side delay quantity control circuit 73 is composed of a second resistor means 73a having a negative temperature coefficient and an N-channel type MOS FET (a fifth NMOS FET) 73b whose drain and gate are connected with one end of the resistor means 73a and whose source is grounded. The other end of the resistor means 73a is connected to the power source. The resistor means 71a of the PMOS side delay quantity control circuit 71 and a node N71 of the P-channel type MOS FET 71b are connected with the gates of the P-channel type MOS FETs 61a and 63a in the delay gate 60. The second resistor means 73a of the NMOS side delay quantity control circuit 73 and a node N73 of the N-channel type MOS FET 73b are connected with the gates of the N-channel type MOS FETs 61d and 63d in the delay gate 60. In these P side and N side delay quantity control circuits 71 and 73, a resistor means having a negative temperature coefficient acts as a voltage dividing resistor. Therefore, in the PMOS side delay quantity control circuit 71, as the ambient temperature (or chip temperature) becomes higher, the potential of the connecting point N71 becomes lower. And in the NMOS side delay quantity control circuit 73, as the ambient temperature (or chip temperature) becomes higher, the potential of the connecting point N73 becomes higher. The voltages of these nodes N71 and N73 can be utilized as control signals for making constant delay quantities in the delay gate 60.

According to the third embodiment, the delay quantity control circuit can be made more simply than the first and the second embodiment.

4. Other Embodiments

First, second and third embodiments have been described above, but the present invention is not limited to the above-mentioned embodiments at all, and can be transformed and modified in various and many manners.

In the first and the second embodiments, for example, it has been explained that the delay gates of the first and the second delay gate groups preferably have the same (including the substantially the same) circuit and layout configuration as those of the delay gates in a PLL circuit, but even if the devices used are different in size and the like between both of the former and latter circuits, it is thought that stabilization of the delay quantities can be made to some degree. Accordingly, within the scope of this purpose, even when the delay gates of the first and the second delay gate group do not have necessarily the same circuit and layout configuration as those of the delay gates in a PLL circuit, it is thought that the above-mentioned object of the invention can be attained.

And in the first and the second embodiments, examples have been described where additionally an NMOS FET 21c (See FIG. 3) is connected in series to the NMOS FET 21b side of the first CMOS inverter 21x as a delay gate of a delay quantity control type. However, without using this NMOS FET 21c, a construction also will do in which a control signal is inputted into the gate of a PMOS FET which is newly provided between the power source and the PMOS FET 21a of the first CMOS inverter 21x. And in the construction shown in FIG. 3, it will do also to input proper control signals, respectively, into the gate of the NMOS FET 21c and the gate of a PMOS FET which is newly provided between the PMOS FET 21a and the power source. It is apparent that a delay quantity control circuit 50 modified in such a way will do if it is changed to a PLL circuit and a ring oscillator which are adaptive to the circuit system of these delay gates.

In the third embodiment, an example has been explained in which the first inverter 61 and the second inverter 63 are provided as the delay gate 60. However, either of the first inverter 61 and the second inverter 63 can be omitted. In that case, an input IN is supplied to the gates of the MOS FETs 63b and 63c.

In the above-mentioned embodiment described with reference to FIG. 4, the second delay gate group 31 has a 2-stage composition (31$_1$ and 31$_2$) and the output data of the 1st-stage delay gate 31$_1$ is used as the reference data S31$_1$, and then it is judged whether or not the input and the output data (Di and S31$_1$) of the 1st-stage delay gate 31$_1$ coincide in logic level with each other, and whether or not the output data (S31$_1$ and S31$_2$) of the 1st-stage and 2nd-stage delay gates 31$_1$ and 31$_2$ coincide in logic level with each other. However, it will do also if the second delay gate group 31 has N stages (where N is an integer satisfying N≧3) and the output of an appropriate pth-stage delay gate (where p is an integer satisfying 1≦p≦N) is used as the reference data, and a bit change detecting signal is generated by increasing more than the above-mentioned embodiments the number of the data which are judged about whether or not they coincide with the reference data.

As will be clearly understood from the above-mentioned explanation, the bit phase synchronizing method of the invention controls delay gates so as to keep always constant their delay quantities by correcting (compensating) for variation in the delay quantity to restore the delay quantities to their original values, even if the delay gates of the first delay gate group for performing a phase adjustment of the input data are varied in their delay quantity. Therefore, the delay gates of the first delay gate group give, respectively, proper phase differences to the input data with good repeatability. Accordingly, this method can guarantee good performance in bit phase synchronization. Particularly, considering that in a bit phase synchronizing process for handling a high-speed input signal, in the past the bit phase synchronization could be improved in reliability only if the design margin for timing were expanded a little, this invention is most significant.

The bit phase synchronizing circuit of the invention is provided with the first delay gate group composed of delay gates of a delay quantity control type for performing a phase adjustment of input data and a delay quantity control circuit for controlling the delay gates. Therefore, even if the delay quantities of the delay gates of the first delay gate group in the bit phase synchronizing circuit are varied due to variation of the ambient temperature and the like, the varied delay quantities can be corrected. Accordingly, the delay gates of the first delay gate group give, respectively, proper phase differences to the input data with good repeatability. Thus, a bit phase synchronizing circuit according to the invention can be implemented which can synchronize the input data in phase with its own reference clock signal more stably than in the prior art.

What is claimed is:

1. A method for attaining bit phase synchronization, comprising the steps of:

generating a control voltage with a control voltage generating circuit that includes a voltage control oscillator, said voltage control oscillator receiving said control voltage, inputting input data into a first delay gate group composed of plural delay gates which are connected in series to one another and which have signal delay quantities, each of the delay gates including a transistor and an inverter connected in series with the transistor between a power source and ground, the transistor having a gate which receives said control voltage, selecting either said input data or delayed data related to said input data and obtained from one of the delay gates in said first delay gate group and outputting the selected data, inputting said selected data into a second delay gate group composed of N delay gates (where N is an integer satisfying N≧2), generating a bit change detecting signal for showing whether or not a change in logic level (also called a bit change) of output data from a pth-stage delay gate of said second delay gate group has happened within a specified time before and after a judgement time, by judging at the same time controlled by a reference clock signal whether or not output data of the pth-stage delay gate (where p is an integer satisfying 1≦p≦N) of said second delay gate group and output data of at least the (p−1)th-stage delay gate (where in case of p=1, the (p−1)th-stage delay gate is considered to be the input point of the second delay gate group) coincide in logic level with each other, and whether or not output data of said pth-stage delay gate and output data of at least the (p+1)th-stage delay gate coincide in logic level with each other, synchronizing said input data in phase with said reference clock signal by changing the selected data that is currently being outputted to another selected data according to said bit change detecting signal, and outputting the changed selected data, and controlling the delay gates of said first delay gate group so as to compensate for variations in the signal delay quantities of these delay gates, by varying said control voltage received by the gates of the transistors within a predetermined range to thereby vary the current available to the inverters, the predetermined range being such that the transistors do not come to be off.

2. The method as defined in claim 1, wherein the delay gates of said second delay gate group also have signal delay quantities, and further comprising the step of controlling the delay gates of said second delay gate group so as to compensate for variations in the signal delay quantity of these delay gates.

3. The method as defined in claim 2, wherein the step of controlling the delay gates of said second delay gate group comprises feeding the control voltage to the delay gates of said second delay gate group, and further comprising the steps of generating the control voltage with a PLL circuit and that includes a voltage control oscillator, and supplying the control voltage to the voltage control oscillator.

4. The method as defined in claim 1, wherein said control voltage generating circuit comprises a PLL circuit.

5. A method for attaining bit phase synchronization, comprising the steps of:

inputting input data into a first delay gate group composed of plural delay gates which are connected in series to one another, selecting either said input data or delayed data related to said input data and obtained from one of the delay gates in said first delay gate group and outputting the selected data, generating a control voltage with a control voltage generating circuit that includes a voltage control oscillator, said voltage control oscillator receiving said control voltage;

inputting said selected data into a second delay gate group composed of N delay gates (where N is an integer satisfying N≧2) which have signal delay quantities, each of the delay gates of said second delay gate group including a transistor and an inverter connected in series with the transistor between a power source and ground, the transistor having a gate which receives said control voltage, generating a bit change detecting signal for showing whether or not a change in logic level (also called a bit change) of output data from a pth-stage delay gate of said second delay gate group has happened within a specified time before and after a judgement time, by judging at the same time controlled by a reference clock signal whether or not output data of the pth-stage delay gate (where p is an integer satisfying 1≦p≦N) of said second delay gate group and output data of at least the (p−1)th-stage delay gate (where in case of p=1, the (p−1)th-stage delay gate is considered to be the input point of the second delay gate group) coincide in logic level with each other, and whether or not output data of said pth-stage delay gate and output date of at least the (p+1)th-stage delay gate coincide in logic level with each other, synchronizing said input data in phase with said reference clock signal by changing said selected data that is currently being outputted to another selected data according to said bit change detecting signal, and then outputting the changed selected data, and controlling the delay gates of said second delay gate group so to compensate for variations in the signal delay quantities of these delay gates, by varying said control voltage received by the gates of the transistors within a predetermined range to thereby vary the current available to the inverters, the predetermined range being such that the transistors do not come to be off.

6. The method as defined in claim 5, wherein said control voltage generating circuit comprises a PLL circuit.

7. A circuit for attaining bit phase synchronization, comprising:

a bit phase adjusting circuit which includes a first delay gate group that receives input data, the first delay gate group being composed of plural delay gates of a delay quantity control type that are connected in series to one another, each of the delay gates having a transistor and an inverter connected in series with the transistor between a power source and ground, the transistor having a gate, and which selects either said input data or delayed data related to said input data and obtained from one of the delay gates in said first delay gate group and outputs the selected data, a bit change detecting circuit which includes a second delay gate group that receives said selected data from said bit phase adjusting circuit, said second delay gate group being composed of N delay gates (where N is an integer satisfying N≧2), and which outputs a bit change detecting signal for showing whether or not a change in logic level (also called a bit change) of output data from a pth-stage delay gate of said second delay gate group has happened within a specified time before and after a judgement time, by judging at the same time controlled by a reference clock signal whether or not output data of the pth-stage delay gate (where p is an integer satisfying 1≦p≦N) of said second delay gate group and output data of at least the (p−1)th-stage delay gate (where in case of p=1, the (p−1)th-stage delay gate is considered to be the input point of the second delay gate group) coincide in logic level with each other, and whether or not output data of said pth-stage delay gate and output data of at least the (p+1)th-stage delay gate coincide in logic level with each other, a changeover signal generating circuit for supplying to said bit phase adjusting circuit a changeover signal for changing the selected data that is currently being outputted to another selected data according to said bit change detecting signal, and a first delay quantity control circuit for generating a control voltage that is supplied to the gates of the transistors of the delay gates in said first delay gate group to compensate for variations in the delay quantities of the delay gates of the first delay gate group by varying the current available to the inverters, the control voltage being in a range such that the transistors do not come to be off, said first delay quantity control circuit including a voltage control oscillator, said voltage control oscillator receiving said control voltage.

8. The circuit as defined in claim 7, wherein said first delay quantity control circuit comprises a PLL circuit and said voltage control oscillator comprises a ring oscillator.

9. The circuit as defined in claim 8, wherein said ring oscillator comprises delay gates, and wherein said delay gates of said first delay gate group have the same circuit and layout configuration as the delay gates of said voltage control oscillator.

10. The circuit as defined in claim 7, wherein:

each delay gate of said first delay gate group comprises first and a second inverters which are connected between a power source and the ground, said first inverter comprises a first PMOS transistor whose collector is connected to said power source, a first NMOS transistor whose drain is connected to the source of said first PMOS transistor, and said transistor with a gate, said transistor with a gate being a second NMOS transistor whose drain is connected to the source of said first NMOS transistor and whose sources is connected to said ground, a common connecting point of the gate of said first PMOS transistor and the gate of said first NMOS transistor serving as a signal input terminal, and said second inverter comprises a second PMOS transistor whose drain is connected to said power source and a third NMOS transistor whose drain is connected to the source of said second PMOS transistor and whose source is connected to said ground, a common connecting point of the gate of said second PMOS transistor and the gate of said third NMOS transistor being connected with a common connecting point of the source of said first PMOS transistor and the source of said first NMOS transistor, a connecting point of the source of said second PMOS transistor and the drain of said third NMOS transistor serving as a signal output terminal.

11. The circuit as defined in claim 7, wherein each of the delay gates of said first delay gate group is a voltage control type delay gate whose delay quantity is controlled by the control voltage supplied to said transistor, and said first delay quantity control means comprises a resistor means having a negative temperature coefficient, the resistor means serving as a voltage dividing resistor, and outputs as said control voltage a voltage varying according to temperature.

12. The circuit as defined in claim 7, wherein:

each delay gate of said first delay gate group comprises first and second inverters which are connected between a power source and the ground, said first inverter comprises a first PMOS transistor whose drain is connected to said power source, a second PMOS transistor whose drain is connected to the source of said first PMOS transistor, a first NMOS transistor whose drain is connected to the source of said second PMOS transistor, and said transistor with a gate, said transistor with a gate being a second NMOS transistor whose drain is connected to the source of said first NMOS transistor and whose source is connected to said ground, a common connecting point of the gate of said second PMOS transistor and the gate of said first NMOS transistor serving as a signal input terminal, said second inverter comprises a third PMOS transistor whose drain is connected to said power source, a fourth PMOS transistor whose drain is connected to the source of said third PMOS transistor, a third NMOS transistor whose drain is connected to the source of said fourth PMOS transistor, and a fourth NMOS transistor whose drain is connected to the source of said third NMOS transistor and whose source is connected to said ground, a common connecting point of the gate of said fourth PMOS transistor and the gate of said third NMOS transistor being connected with a connecting point of the source of said second PMOS transistor and the source of said first NMOS transistor, and a connecting point of the source of said fourth PMOS transistor and the drain of said third NMOS transistor serving as a signal output terminal, said first delay quantity control circuit comprises a fifth NMOS transistor whose source is connected to ground and a first resistor means having a negative temperature coefficient which is connected between the drain of said fifth NMOS transistor and said power source, the gate and the drain of said fifth PMOS transistor being connected with a common connecting point of the gates of said second and fourth NMOS transistors, and said circuit for attaining bit phase synchronization further comprises a second delay quantity control circuit for compensating for variations in the delay quantities of the delay gates in the first delay gate group, the second delay quantity control circuit including a fifth PMOS transistor whose drain is connected to said power source and a second resistor means having a negative temperature coefficient which is connected between the source of said fifth PMOS transistor and ground, the gate and the source of said fifth PMOS transistor being connected with a common connecting point of the gates of said first and third PMOS transistors.

13. The circuit as defined in claim 7, wherein the delay gates of said second delay gate group are delay gates of a delay quantity control type, which receive said control voltage so as to compensate for variations in the delay quantity of the delay gates of the second delay gate group.

14. The circuit as defined in claim 13, wherein said first delay quantity control circuit comprises a PLL circuit which has a voltage control oscillator composed of a ring oscillator, said voltage control oscillator receiving said control voltage.

15. The circuit as defined in claim 14, wherein said voltage control oscillator comprises delay gates, and wherein the delay gates of said second delay gate group have the same circuit and layout configuration as the delay gates of said voltage control oscillator.

16. The circuit as defined in claim 13, wherein said first delay quantity control circuit comprises a resistor means having a negative temperature coefficient, the resistor means serving as a voltage dividing resistor, and outputs as said control voltage a voltage according to temperature.

* * * * *